United States Patent [19]
Lee

[11] Patent Number: 5,469,478
[45] Date of Patent: Nov. 21, 1995

US005469478A

[54] DIGITAL PHASE LOCK LOOP FOR JITTER FILTERING AND FREQUENCY OFFSET COMPENSATION

[75] Inventor: Johnny C. Lee, Santa Clara, Calif.

[73] Assignee: National Semiconductor Corporation, Santa Clara, Calif.

[21] Appl. No.: 275,795

[22] Filed: Jul. 15, 1994

[51] Int. Cl.⁶ .................................. H03D 3/24; H03L 7/00
[52] U.S. Cl. ........................ 375/376; 375/374; 375/373; 331/1 A; 331/14
[58] Field of Search ...................................... 375/118, 119, 375/120, 374; 331/1 A, 14, 17, 25

[56] References Cited

U.S. PATENT DOCUMENTS

| | | | |
|---|---|---|---|
| 5,077,529 | 12/1991 | Ghoshal et al. | 375/118 |
| 5,200,982 | 4/1993 | Weeber | 375/118 |
| 5,258,877 | 11/1993 | Leake et al. | 375/120 |
| 5,272,730 | 12/1993 | Clark | 375/120 |
| 5,329,560 | 7/1994 | Rastegar et al. | 375/120 |

OTHER PUBLICATIONS

FDDI Hybrid Ring Control (HRC) Draft Proposed American National Standard; Points of Contact: Gene Milligan (X3T9.5 Chairman) and Floyd Ross (X3T9.5 Vice Chairman; May 28, 1992.

*Primary Examiner*—Stephen Chin
*Assistant Examiner*—Huong Luu
*Attorney, Agent, or Firm*—Limbach & Limbach

[57] ABSTRACT

A digital phase lock loop for producing an output signal based on an input signal which is subject to jitter and frequency offset. The output signal follows the center of the jitter on the input signal to produce a jitter-filtered signal which compensates for the frequency offset. The digital phase lock loop includes a phase detector, a pulse scaler counter, a phase error counter and a first digitally controlled oscillator. The phase detector detects a phase difference between the input signal and the output signal and outputs up or down pulses depending on the phase difference. The pulse scaler counter increments an up/down counter when an up pulse is received from the phase detector, and decrements the up/down counter when a down pulses is received from the phase detector. When the up/down counter overflow or underflows, a correction pulse is output. The phase error counter resets during every cycle of the input and output signals. The phase error counter will increment an up counter when an up or down pulse is received from the phase detector. When the up counter overflows, a correction pulse is output. The first digitally controlled oscillator produces and outputs the output signal. The first digitally controlled oscillator adjusts the phase of the output signal depending on the correction pulses received from the pulse scaler counter and the phase error counter.

28 Claims, 6 Drawing Sheets

DIGITAL PHASE LOCK LOOP FOR JITTER FILTERING AND FREQUENCY OFFSET COMPENSATION

BACKGROUND OF THE INVENTION

1. Field of the Invention

The present invention relates to digital phase lock loops and more specifically to digital phase lock loops used to filter jitter and frequency offset from a periodic input signal.

2. Background Art

Periodic signals transmitted on a transmission medium are often subject to jitter. Jitter occurs when a periodic signal centers about a certain phase orientation, but a given cycle of the periodic signal is prone to be slightly shined in phase from the center phase orientation. In other words, a given cycle may lead (i.e. occur earlier than) or lag (i.e. occur later the) a hypothetical signal which is exactly in phase with the center phase orientation.

Jitter itself is often a periodic phenomenon. Jitter, the amount of lead or lag (measured in units of time) on each successive cycle of a waveform, will often exhibit a waveform such as a sinusoidal waveform, a triangular waveform, etc. A periodic jitter waveform has a peak-to-peak amplitude which is the sum of the maximum lead and the maximum lag.

It is sometimes desirable to produce a periodic output signal which is in phase with the center phase orientation of a periodic input signal. One device for accomplishing this objective is a digital phase lock loop. Such a digital phase lock loop is shown in FIG. 1 d will be described below with reference to FIGS. 1 and 2.

A square, periodic signal $I/P_1$ is supplied to a synchronous phase detector 10. The synchronous phase detector 10 is digital and operates based on a sampling frequency which is of a higher frequency than the frequency of the input signal $I/P_1$. Also supplied to the synchronous phase detector is a square, jitter-filtered, periodic output signal $O/P_1$ which has the se frequency as the input signal $I/P_1$, and has a phase orientation close to the center phase orientation of the input signal. There will generally be a phase difference between the input signal $I/P_1$ and the output signal $O/P_1$ which corresponds to the jitter. This jitter may be measured, for example, at corresponding rising edges of the input signal $I/P_1$ and the output signal $O/P_1$.

The synchronous phase detector 10 will output a number of successive up pulses on a first up signal $U_1$ when the input signal $I/P_1$ leads the output signal $O/P_1$. The number of up pulses is proportional to the mount of time by which the input signal $I/P_1$ leads the output signal $O/P_1$. For example, in FIG. 2, at time $T_2$, the input signal $I/P_1$ leads the output signal $O/P_1$ by 2 counts of the sampling frequency of the synchronous phase detector 10. Therefore, the first up signal $U_1$ of the synchronous phase detector 10 outputs two successive up pulses.

Similarly, the synchronous phase detector 10 will output a number of down pulses on a first down signal $D_1$ when the output signal $O/P_1$ leads the input signal $I/P_1$. The number of down pulses is proportional to the amount by which the output signal $O/P_1$ leads the input signal $I/P_1$. For example, in FIG. 2, at time $T_4$, the output signal $O/P_1$ leads the input signal $I/P_1$ by 1 count of the sampling frequency of the synchronous phase detector 10. Therefore, the first down signal $D_1$ of the synchronous phase detector 10 outputs one down pulse.

The first up signal $U_1$ and the first down signal $D_1$ are supplied to a 4-bit up/down counter 12. The up/down counter 12 will increment (i.e. add one to its count) each time an up pulse is received on the first up signal $U_1$. For example, in FIG. 2, at time $T_2$, two up pulses are supplied to the up/down counter 12. Therefore, the up/down counter 12 increments by two, from 1101h to 1111h. Note that numbers followed by an 'h' are in binary form. The up/down counter 12 will decrement (i.e. subtract one from its count) each time a down pulse is received on the first down signal $D_1$. For example, in FIG. 2, at time $T_4$, one down pulse is supplied to the up/down counter 12. Therefore, the up/down counter 12 decrements by one, from 1111h (shown at time $T_4$) to 1110h (shown at time $T_5$).

When the 4-bit up/down counter 12 is at its maximum count, 1111h, and it receives another up pulse, then the up/down counter 12 overflows. In this example, the count of the up/down counter 12 rolls over to 0000h at overflow, and the up/down counter 12 sends out an up pulse on a second up signal $U_2$. This is shown in FIG. 2, at time $T_6$. At time $T_5$, the count of the up/down counter 12 is 1110h. Just before $T_6$ the up/down counter 12 receives two, successive up pulses. The first of these up pulses causes the up/down counter 12 to increment to 1111h, as explained above. The second of these up pulses causes the counter to overflow and roll over to 0000h. Therefore, a second up pulse (called a correction pulse) is output on the second up signal $U_2$.

When the 4-bit up/down counter 12 is at its minimum count, 0000h, and it receives another down pulse, then the up/down counter 12 underflows. In this example, the count of the up/down counter 12 rolls to 1111h at underflow, and the up/down counter 12 sends out a down pulse on a second down signal $D_2$.

The second up signal $U_2$ and the second down signal $D_2$ are supplied to a digitally controlled oscillator 14. The digitally controlled oscillator 14 produces the output signal $O/P_1$. When an up pulse is received on the second up signal $U_2$, then the digitally controlled oscillator 14 will adjust the phase of the output signal $O/P_1$ in the leading direction (i.e. it will make the output signal $O/P_1$ shift to an earlier time). When a down pulse is received on the second down signal $D_2$, then the digitally controlled oscillator 14 will adjust the phase of the output signal $O/P_1$ in the direction opposite the leading direction (i.e. it will make the output signal $O/P_1$ shift to a later time).

The output signal $O/P_1$ is fed back from the digitally controlled oscillator 14 to synchronous phase detector 10. By this feedback, the up/down counter insures that the output signal $O/P_1$ follows close to the average center of the jitter on the input signal $I/P_1$.

However, an input signal may be subject to frequency offset and jitter at the same time. Frequency offset occurs when the frequency of the input signal and output signal drift apart. This often occurs due to slight differences in high frequency sampling clocks used to generate the input and output signals respectively. Frequency offset can causes an increasing phase difference between the input signal and the output signal over time. If frequency offset is not compensated for, then the phase of the output signal will tend to be driven in either the leading or the lagging direction with respect to the input signal.

One example of a periodic signal which is subject to jitter and frequency offset is the 8 kilohertz clock signal which is typically transmitted over telephone lines in conjunction with digital data communication over the telephone lines. These signals are typically subject to jitter of about 1.3 microseconds peak-to-peak amplitude with a jitter frequency down to 1 hertz. It can be helpful to have an 8 kilohertz clock locked to the center of the transmitted 8 kilohertz clock for purposes such as effective detection and modulation/demodulation of digital data communicated over the telephone line in sync with the transmitted 8 kilohertz clock.

If a digital phase lock loop, such as that described above, is used to filter jitter from an input signal, then the output signal may not respond well to account for frequency offset. In fact, there is a risk that frequency offset can cause the input and output signals to become so far out of phase that data communicated in sync with the input signal will be lost when transmitted to components operating based on the output signal of the digital phase lock loop.

SUMMARY OF THE INVENTION

A digital phase lock loop according to the present invention can provide a jitter filtered, periodic output signal based on a periodic input signal which is subject to jitter and frequency offset. The digital phase lock loop of the present invention includes a phase detector, a pulse scaler counter, a phase error counter and a first digitally controlled oscillator.

The phase detector receives the input signal and the output signal. The phase detector detects a phase difference between the input signal and the output signal. The phase detector will output a number of first up pulses or first down pulses depending on the phase difference between the input and output signals. The phase detector will output first up pulses when the input signal leads the output signal (i.e. when the input signal occurs earlier). The phase detector will output first down pulses when the output signal leads the input signal. The number of up or down pulses is proportional to the magnitude of the phase difference between the input and output signals.

The pulse scaler counter receives the first up pulses and the first down pulses. The pulse scaler counter increments an up/down counter (e.g., adds one to the value in the up/down counter) when a first up pulse is received. The pulse scaler counter decrements the up/down counter (e.g., subtracts one from the value in the up/down counter) when a first down pulse is received. The pulse sealer counter will output a second up pulse when the up/down counter overflows. The up/down counter overflows when the counter is already at maximum value and is then incremented to roll over to the minimum value. The pulse scaler counter will output a second down pulse when the up/down counter underflows. The up/down counter underflows when it is already at its minimum value and is then decremented to roll to the maximum value.

The phase error counter receives the input signal, the output signal, the first up pulses and the first down pulses. The phase error counter resets an up counter during each period of the input and output signals. The phase error counter increments the up counter when a first up pulse is received. The phase error counter also increments the up counter when a first down pulse is received. The phase error counter will output a third up pulse when the up counter overflows and the input signal leads the output signal. The phase error counter will output a third down pulse when the up counter overflows and the output signal leads the input signal.

The first digitally controlled oscillator produces and outputs the output signal. The first digitally controlled oscillator receives the second up pulses, the second down pulses, the third up pulses and the third down pulses. The first digitally controlled oscillator adjusts the phase of the output signal based the up or down pulses it receives. The first digitally controlled oscillator will shift the output signal in the leading direction (i.e. to occur earlier) when a second or third up pulse is received. The first digitally controlled oscillator will shift the output signal in the direction opposite the leading direction (i.e. to occur later) when a second or third down pulse is received.

Further objects and advantages of the present invention will become apparent in light of the following detailed description of the preferred embodiments and accompanying drawings.

DETAILED DESCRIPTION OF THE PREFERRED EMBODIMENTS

A preferred embodiment of a digital phase lock loop according to the present invention will be described with reference to FIGS. 3 and 4. The phase lock loop is used to produce an output signal $O/P_2$ based on an input signal $I/P_2$. The input signal $I/P_2$ is subject to jitter and frequency offset. Both the input signal $I/P_2$ and the output signal $O/P_2$ are periodic, square waveforms with the same nominal frequency. While this embodiment is being described with respect to these specific input and output signal characteristics, it is to be understood that other input and output characteristics are also possible, such as different waveforms for the input and output signals.

It is desired that the output signal $O/P_2$ be locked in phase near the center of the jitter of the input signal $I/P_2$. However, over time the center of the jitter on the input signal $I/P_2$ may itself shift in phase due to frequency offset. The output signal $O/P_2$ should follow the close to center of the jitter, while minimizing phase fluctuations of the output signal $O/P_2$ about the center of the jitter. This fluctuation of the output signal $O/P_2$ about the center of the jitter is called resultant jitter.

Figure 1:
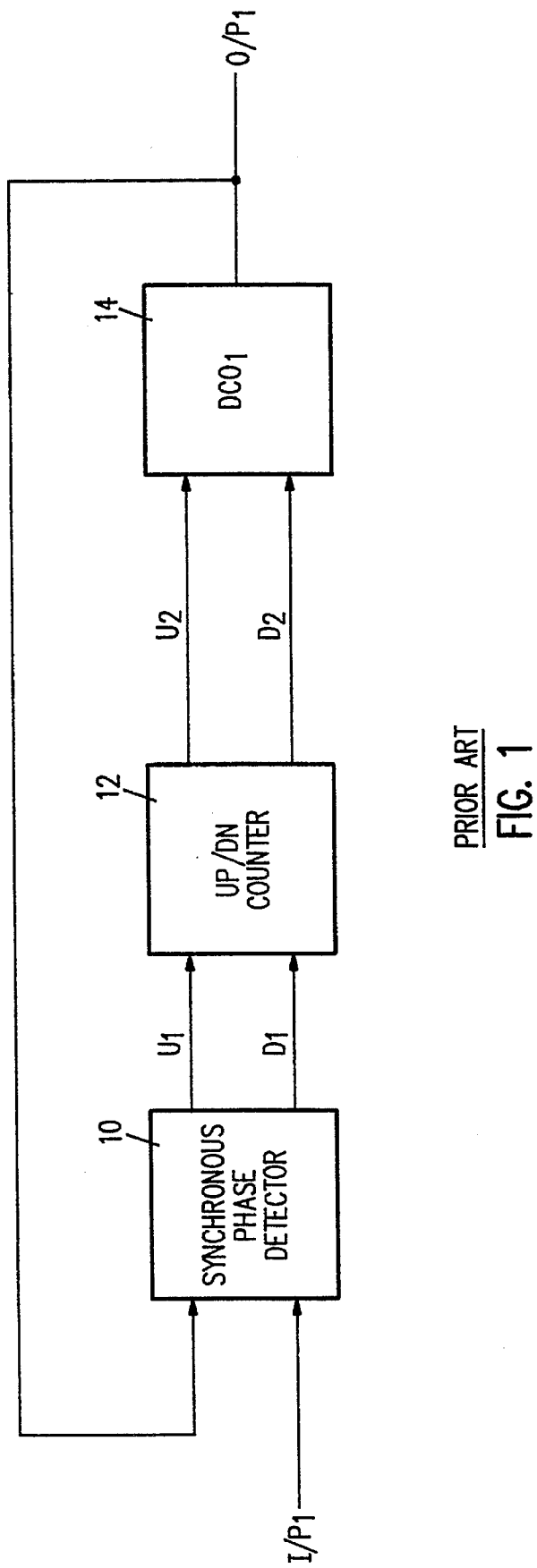
FIG. 1 is a diagram of a prior art digital phase lock loop.
Figure 2:
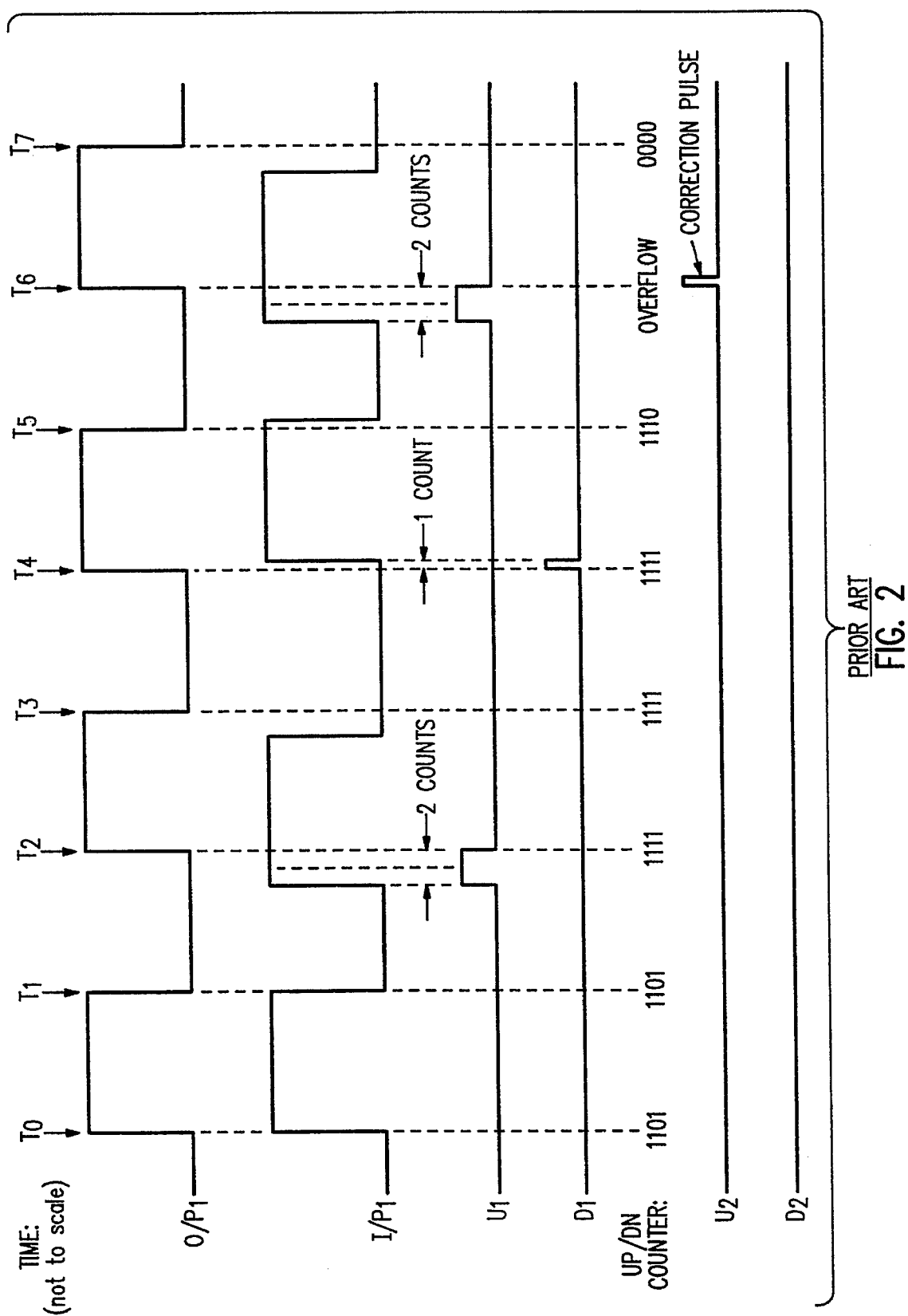
FIG. 2 is a diagram showing the operation of the phase lock loop of FIG. 1.

The input signal $I/P_2$ and the output signal $O/P_2$ are supplied to a digital synchronous phase detector 100. The synchronous phase detector 100 outputs a first up signal $U_3$ and a first down signal $D_3$. This synchronous phase detector can be similar in construction to the synchronous phase detector 10 discussed above in connection with FIGS. 1 and 2. The digital synchronous phase detector 100 is based on a high frequency sampling clock (not shown), which may be externally supplied. The high frequency digital sampling clock can be supplied to any of the digital components of the phase lock loop to control sampling in synchronization.

When the input signal $I/P_2$ leads the output signal $O/P_2$, the synchronous phase detector 100 will produce one or more first up pulses on the first up signal $U_3$. The number of up pulses is proportional to the magnitude of the phase difference between the input signal $I/P_2$ and the output signal $O/P_2$. This phase difference is measured once per corresponding cycles of the input signal $I/P_2$ and output signal $O/P_2$. For example the phase difference may be measured at a rising edge of the square pulse waveforms. This is shown in FIG. 4, at time $T_3$ to time $T_5$ where the rising edge of the input signal $I/P_2$ leads (i.e. occurs earlier than) the rising edge of the output signal $O/P_2$ by 9 counts of the high frequency sampling clock. Accordingly, the synchronous phase detector 100 outputs 9 successive first up pulses on the first up signal $U_3$.

Similarly, when the rising edge of the output signal $O/P_2$ leads the corresponding rising edge of the input signal $I/P_2$, then first down pulses will be output on the first down signal $D_2$. This is shown in FIG. 4, at time $T_0$ to time $T_1$, where the output signal $O/P_2$ leads the input signal $I/P_2$ by 4 counts of the high frequency sampling clock. Accordingly, 4 successive first down pulses are output on the first down signal $D_3$.

It is to be understood that other types of phase detectors are also possible. For example, the phase detectors might compare the falling edge of corresponding cycles. Also, an asynchronous phase detector might be used. As another possible variation, the first up and first down signals can be either active 'high' or active 'low'.

The pulse scaler counter 102 includes an up/down counter which operates in a similar way to the up/down counter 12 described above in connection with FIGS. 1 and 2. The pulse scaler counter 102 outputs a second up signal $U_4$ and a second down signal $D_4$. Second up pulses are output on the second up signal $U_4$ when the up/down counter overflows. Second down pulses are output on the second down signal $D_4$ when the up/down counter underflows. These second up pulses and second down pulses are called correction pulses. The pulse scaler counter 102 will be described in more detail below.

The first digitally controlled oscillator 104 also operates in a similar way to the digitally controlled oscillator 14 described above in connection with FIG. 1. The first digitally controlled oscillator 104 may also be based on the high frequency sampling clock, or on some multiple or fractional output thereof. The first digitally controlled oscillator 104 produces the output signal $O/P_2$ which is fed back to the synchronous phase detector 100 and which can be supplied to external components (not shown). The first digitally controlled oscillator 104 will be further described below.

The phase error counter 106 is supplied with the input signal $I/P_2$, the output signal $O/P_2$, first up signal $U_3$ and the first down signal $D_3$. In this embodiment, the phase error counter 106 includes a 3-bit up counter. When a corresponding rising edges of an input signal cycle and output signal cycle are supplied to the phase error counter 106, the phase error counter 106 will detect the earlier rising edge and will use this as a trigger to reset the up counter. This is shown at FIG. 4, at time $T_2$ to time $T_3$. At time $T_2$ the count of the 3-bit up counter PEC is 100h. At time $T_3$ the phase error counter detects the rising edge of a cycle of the input signal $I/P_2$ and the counter is reset to 000h. It is possible to construct the phase error counter 106 to reset the up counter at some other point in the corresponding cycles of the input and output signals.

The phase error counter 106 will increment the 3-bit up counter when either first up pulses or first down pulses are received from the synchronous phase detector 100. For example, as shown in FIG. 4, between time $T_0$ and time $T_1$, 4 successive first down pulses are received on the first down signal $D_3$ from the synchronous phase detector 100. Accordingly, the 3-bit digital counter PEC increments 4 times from a value of 000h to 100h.

In this embodiment, the 3-bit up counter can only be incremented 8 times, to a maximum vale of 111h. Any attempt to increment the counter when it has a value of 111h will result in overflow. This is shown in FIG. 4 at time $T_3$ to time $T_5$. Between these times, 9 successive first up pulses are received on the first up signal $U_3$. The 3-bit up counter PEC is incremented 8 times, from 000h to 111h. The ninth first up pulse causes an overflow. In this embodiment, the 3-bit up counter remains at its maximum value (111h) at overflow.

The phase error counter 106 output a third up signal $U_5$ and a third down signal $D_5$. When the 3-bit counter overflows due to the receipt of a first up pulse, then a third up pulse will be output on the third up signal $U_5$. This is shown in FIG. 4 at time $T_5$. Similarly, if the 3-bit up counter PEC overflows due to the receipt of a first down pulse, then a third down pulse will be output on the third down signal $D_5$. These third up pulses and third down pulses are also called correction pulses.

The second up signal $U_4$ and third up signal $U_5$ are supplied to an 'or' gate 112. The 'or' gate 112 outputs a fourth up signal $U_6$ to the first digitally controlled oscillator 104. A fourth up pulse will be output on the fourth up signal $U_6$ when there is an up pulse present on either or both of the second up signal $U_4$ and the third up signal $U_5$. When the first digitally controlled oscillator 104 receives a fourth up pulse on the fourth up signal $U_6$, the first digitally controlled oscillator 104 will adjust the phase of the output signal $O/P_2$ in the leading direction (i.e. shift the output signal to occur earlier).

The second down signal $D_4$ and third down signal $D_5$ are supplied to an 'or' gate 114. The 'or' gate 114 outputs a fourth down signal $D_6$ to the first digitally controlled oscillator 104. A fourth down pulse will be output on the fourth down signal $D_6$ when there is a down pulse present on either or both of the second down signal $D_4$ and the third down signal $D_5$. When the first digitally controlled oscillator 104 receives a fourth down pulse on the fourth down signal $D_6$, the first digitally controlled oscillator 104 will adjust the phase of the output signal $O/P_2$ in the direction opposite the leading direction (i.e. shift the output signal to occur later).

The 'or' gates 112, 114 described in connection with this preferred embodiment are not the only possible means of transmitting up and down pulses to the first digitally controlled oscillator 104. For example, the second and third up signals and the second and third down signals could be supplied directly to the first digitally controlled oscillator 104.

Figure 3:
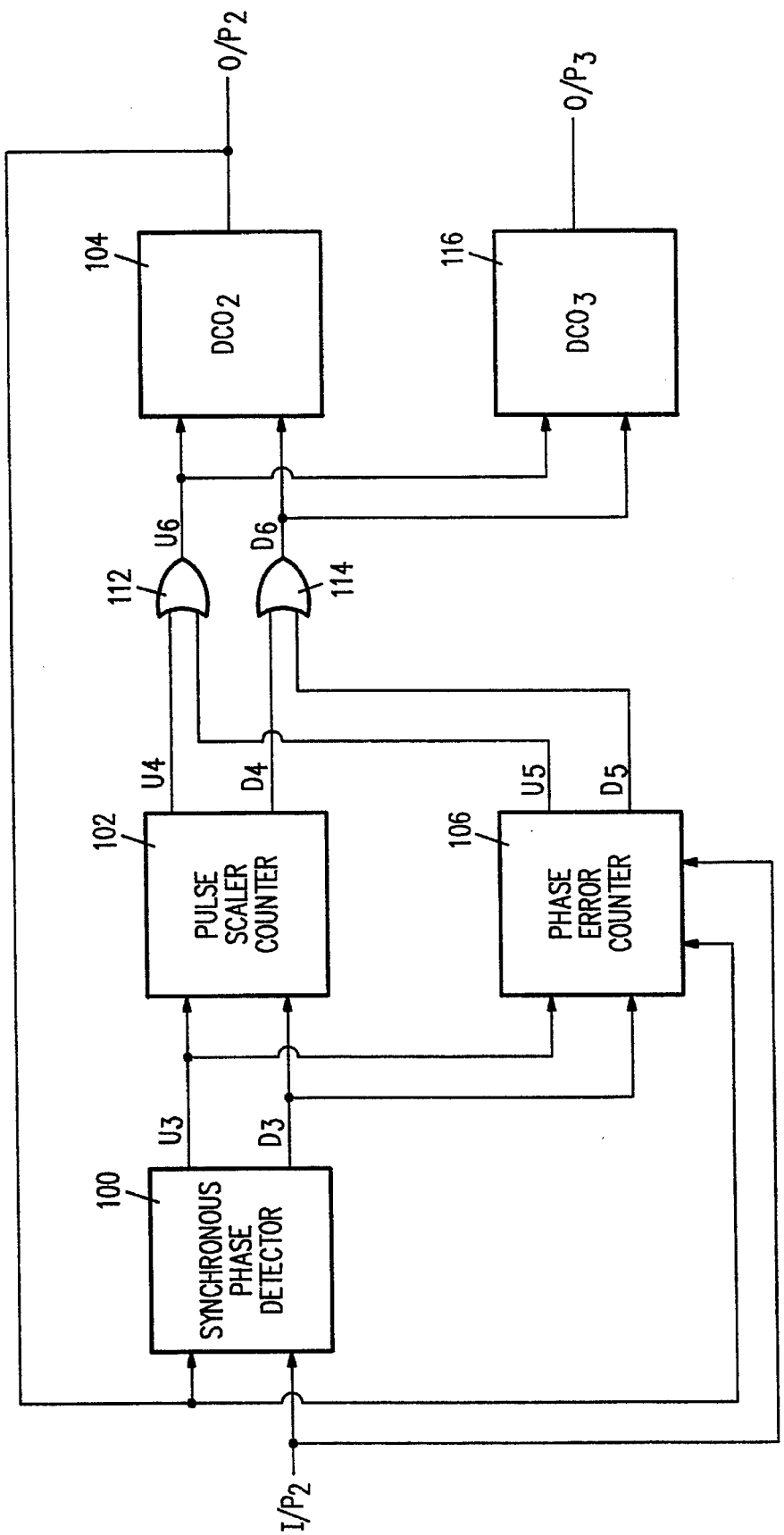
FIG. 3 is a diagram of an embodiment of a phase lock loop according to the present invention.
Figure 4:
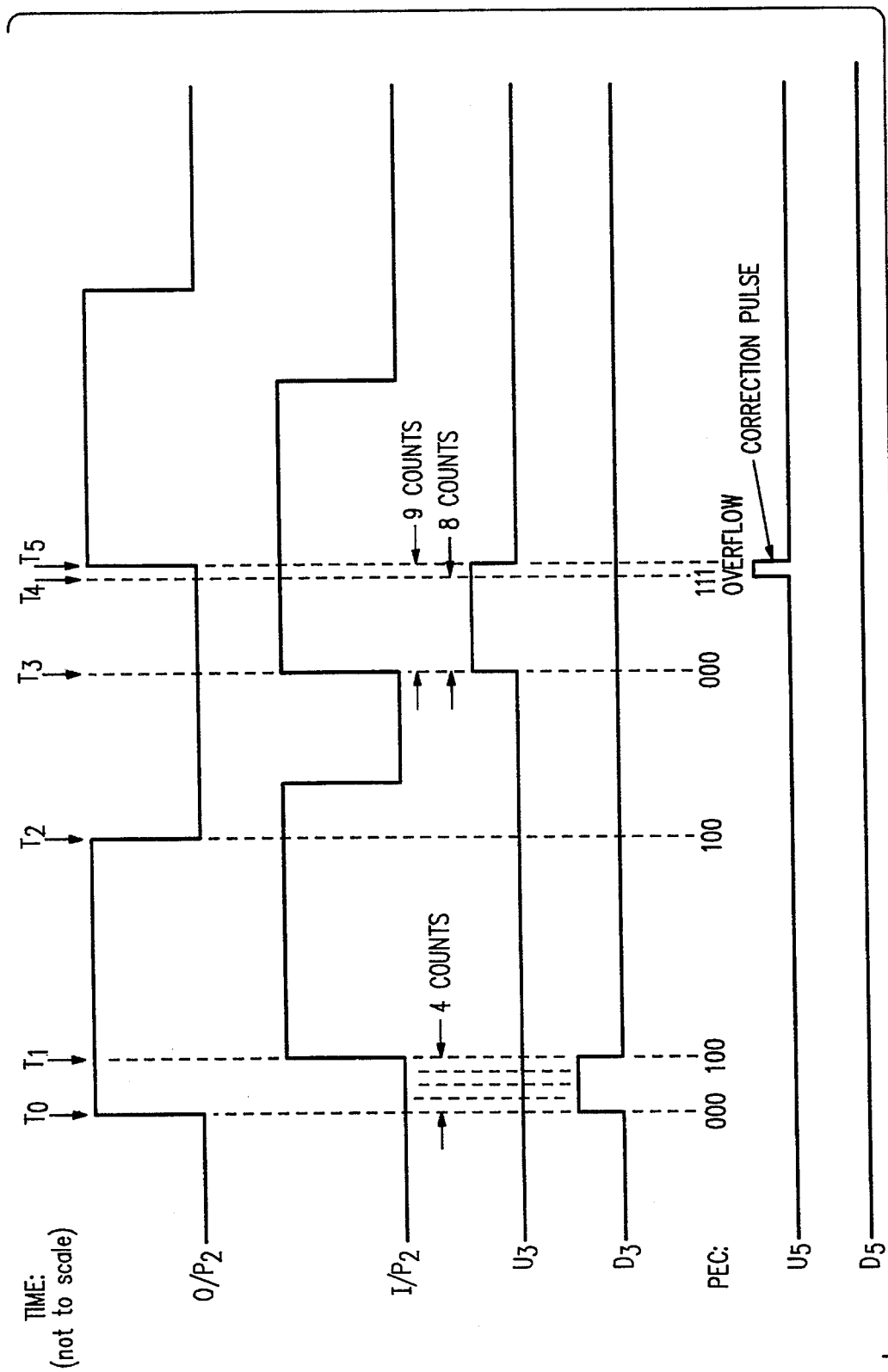
FIG. 4 is a diagram showing the operation of the phase lock loop of FIG. 3.

The digital phase lock loop of FIG. 3 also includes a second digitally controlled oscillator 116. This oscillator can be used to produce an output signal $O/P_3$ which maintains a predetermined phase offset from the center of the jitter on the input signal $I/P_2$.

Digital phase lock loops such as the one in FIG. 3 can be used to generate output signals which follow close to the phase of an input signal which is subject to both jitter and frequency offset.

Figure 5:
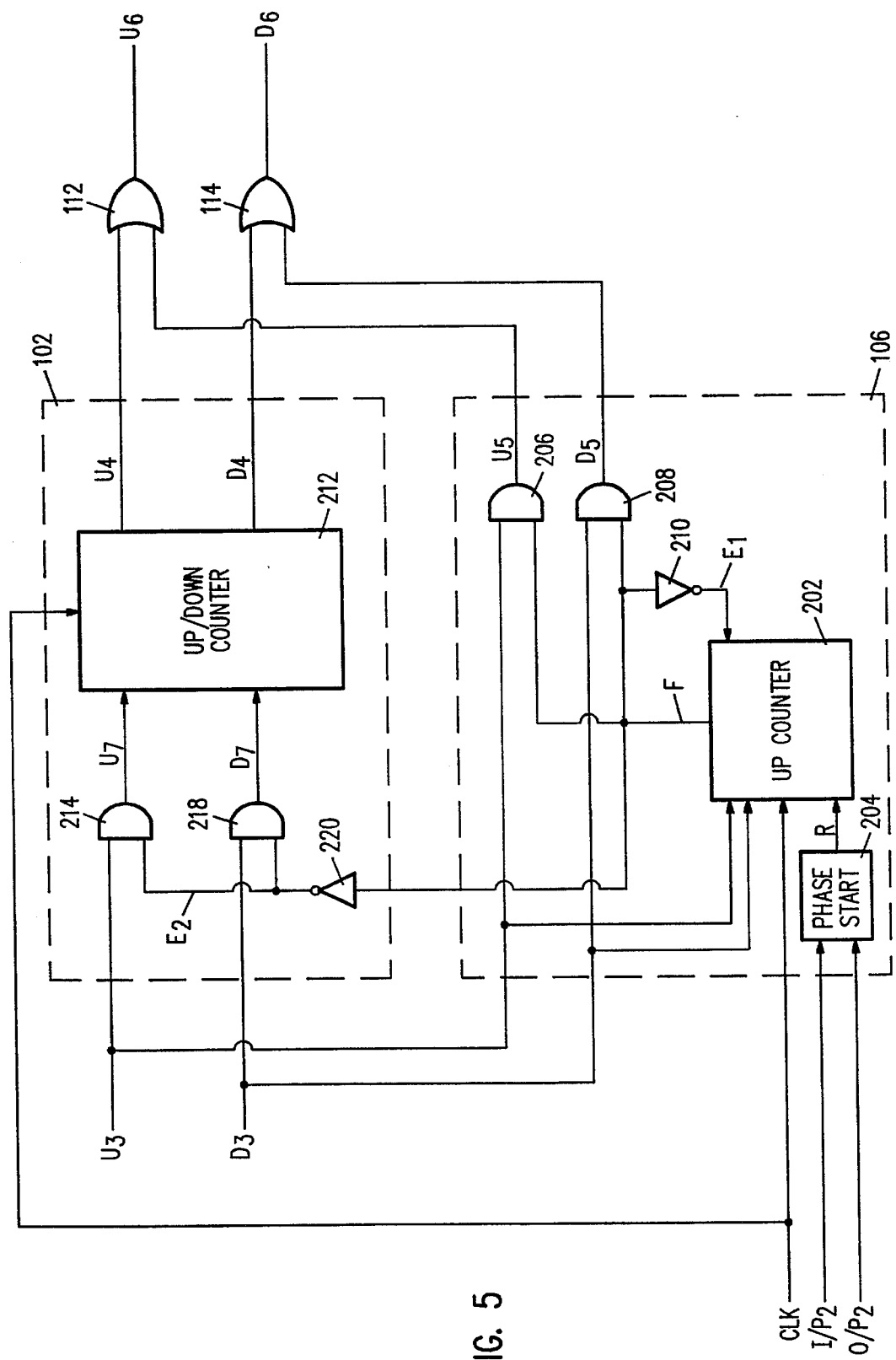
FIG. 5 is a diagram showing in detail portions of a phase lock loop according to the present invention.

FIG. 5 shows a detailed embodiment of the pulse scaler counter 102 and the phase error counter 106 portions of a digital phase lock loop. The phase error counter 106 includes an up counter 202 which can serve as the 3-bit digital up counter described above. The up counter 202 is supplied with the first up signal $U_3$, the first down signal $D_3$ and the high frequency digital sampling clock CLK discussed above. When the up counter overflows (as discussed above), it outputs an overflow pulse on an overflow signal F.

As discussed above, the up counter 202 will reset at the earlier rising edge of a corresponding pair of cycles of the input signal $I/P_2$ and the output signal $O/P_2$. This is accomplished by a phase start circuit 204. The phase start circuit receives the input signal $I/P_2$ and the output signal $O/P_2$. The phase start circuit 204 outputs a reset signal R to the up counter. When the phase start circuit detects the earlier rising edge of the input signal $I/P_2$ and the output signal $O/P_2$, it outputs a reset pulse on the reset signal R. The reset pulse causes the up counter 202 to reset.

The phase error counter 106 also includes a first 'and' gate 206. The first 'and' gate 206 receives the first up signal $U_3$ and the overflow signal F. The first 'and' gate 206 outputs the third up signal $U_5$. The first 'and' gate 206 will output a third up pulse on the third up signal $U_5$ only when a first up pulse and an overflow pulse are received simultaneously. In this way, the phase error counter 106 is prevented from outputting a third up pulse on the third up signal $U_5$ when the up counter 202 has overflowed and sent out an overflow pulse due to the receipt of first down pulses.

Similarly, the phase error counter 106 includes a second 'and' gate 208. The second 'and' gate 208 receives the first down signal $D_3$ and the overflow signal F. The second 'and' gate 208 outputs the third down signal $D_5$. The second 'and' gate 208 will output a third down pulse on the third down signal $D_5$ only when a first down pulse and an overflow pulse are received simultaneously. In this way, the phase error counter 106 is prevented from outputting a third down pulse on the third down signal $D_5$ when the up counter 202 has overflowed and sent out an overflow pulse due to the receipt of first up pulses.

The embodiment of the phase error counter 106 shown in FIG. 5 also includes a first invertor 210. The first invertor 210 receives the overflow signal F and inverts it to output a first enable signal $E_1$ to the up counter 202. The first enable signal $E_1$ works to enable and disable the functioning to the up counter 202. When the first invertor 210 receives an overflow pulse (or pulses) on the overflow signal F, the first invertor 210 will output the enable signal $E_1$ which disables the functioning of the up counter 202.

The pulse scaler counter 102 includes an up/down counter 212. This can be constructed as, for example, a 16-bit digital up/down counter. Selection of an appropriate up/down counter will be further described below. The up/down counter 212 outputs the second up signal $U_4$ and the second down signal $D_4$ as described above.

This embodiment includes some additional design features involved in delivering the up and down pulses to the up/down counter 212. Specifically, The up/down counter 212 is supplied with up and down pulses on a fifth up signal $U_7$ and a fifth down signal $D_7$ respectively.

The fifth up signal $U_7$ is output by a third 'and' gate 214. The third 'and' gate 214 is supplied with the first up signal $U_3$ and a second enable signal $E_2$. The second enable signal $E_2$ is supplied through a second invertor 220. The second enable signal $E_2$ will remain 'on' (or high) as long as there is no overflow pulse on the overflow signal F from the up counter 202. However, when an overflow pulse is received by the second invertor 220, the second enable signal will go 'off' (or low). The third 'and' gate 214 will output a fifth up pulse on the fifth up signal $U_7$ only when a first up pulse is received and the second enable signal $E_2$ is on simultaneously. In this way, fifth up pulses are prevented from being sent to the up/down counter 212 while the up counter 202 is outputting overflow pulses.

The fifth down signal $D_7$ is output by a fourth 'and' gate 218. The fourth 'and' gate 218 is supplied with the first down signal $D_3$ and the second enable signal $E_2$. The fourth 'and' gate 218 will output a fifth down pulse on the fifth down signal $D_7$ only when a first down pulse is received and the second enable signal $E_2$ is on simultaneously. In this way, fifth down pulses are prevented from being sent to the up/down counter 212 while the up counter 202 is outputting overflow pulses.

One application for digital phase lock loops, such as the embodiments described above, is thought to be for locking an output signal to an 8 kilohertz clock (square waveform) input signal transmitted in conjunction with transmission of data over telephone lines. Such input signals are susceptible to jitter and frequency offset due to the process of long distance transmission. The jitter observed on such input signals can be modelled as a periodic, triangular waveform with a frequency down to about 1 hertz. The peak-to-peak amplitude of the jitter is about 1.3 microseconds.

By using a digital phase lock loop, such as that described above, utilizing a 16-bit pulse scaler counter (up/down counter), a 3-bit phase error counter (up counter) and a high frequency sampling clock of 12.5 megahertz, the resultant jitter on the output signal can be reduced to a peak-to-peak amplitude of 40 nanoseconds.

One aspect of constructing a digital phase lock loop circuit according to the present invention is the choice of size of the pulse scaler counter (up/down counter). A wider (higher bit number) counter is required when the jitter has a higher peak-to-peak amplitude. A wider counter is also required for lower frequency jitter. When the jitter can be modelled as having a periodic, triangular waveform having a frequency f (in hertz) and a peak-to-peak amplitude p (in nanoseconds), then the number of bits n in the up/down counter to keep the resultant jitter at a low level can be given by the formula:

$$n = \log_2(p/160+1)/0.001f)$$

Also, when constructing a digital phase lock loop according to the present invention, the phase error counter (up counter) should be made with a large enough bit number so that the jitter on the input signal does not overflow the phase error counter.

For example, if the peak-to-peak amplitude of the jitter corresponds to 16 counts of the high frequency sampling clock, then the jitter on peak jitter cycles of the input signal will be as high as 8 counts of the high frequency sampling clock. Therefore, jitter on the input signal may cause a phase difference between the input and output signal corresponding to 8 up or down pulses, even when the output signal is in perfect phase with the center of the jitter on the input signal. In this case, a phase error counter should be at least 3 bits (8 counts), so that these jitter peaks on the input signal do not overflow the phase error counter.

Figure 6:
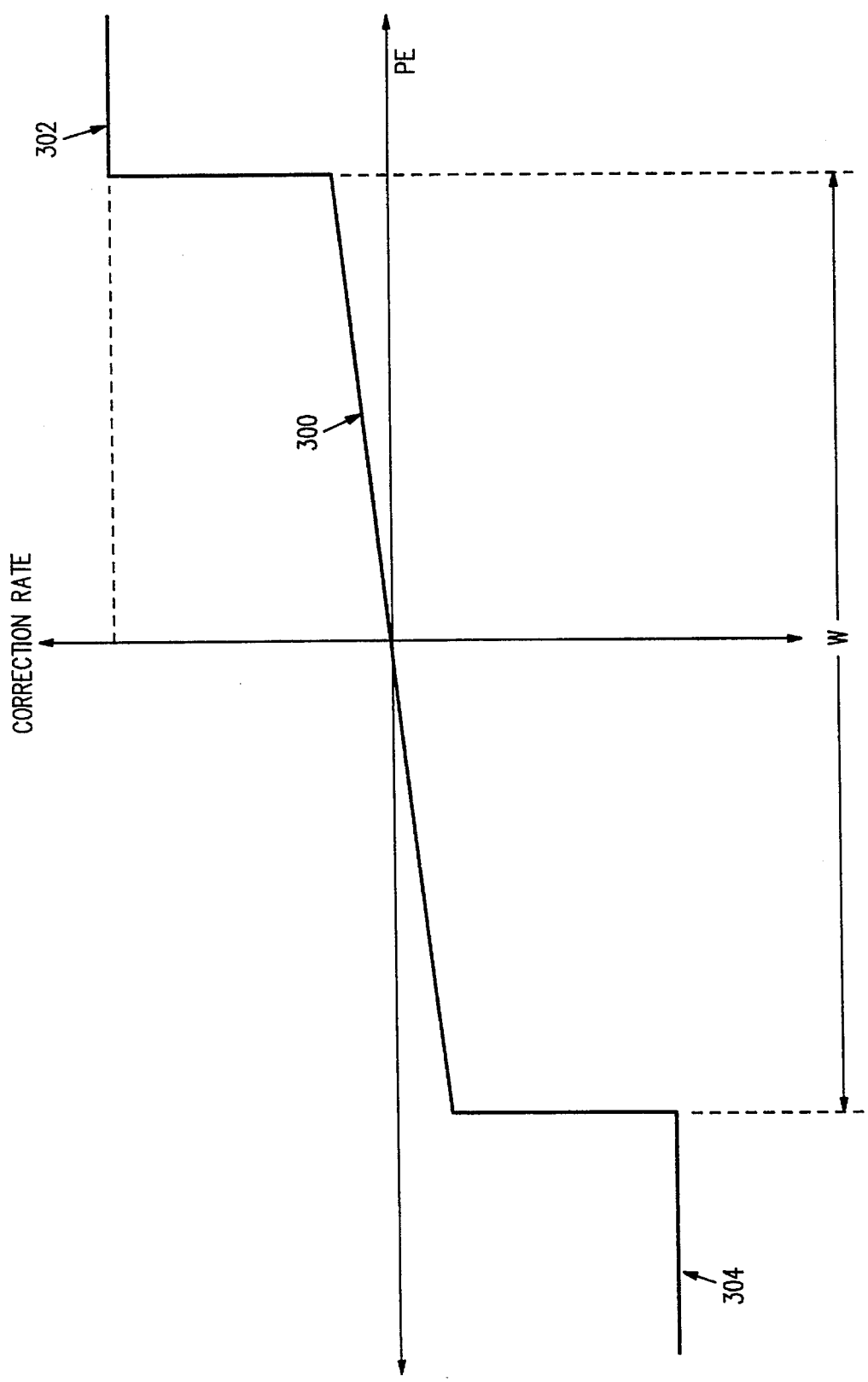
FIG. 6 is a graph showing a correction rate characteristic typical of some embodiments of phase lock loops according to the present invention.

FIG. 6 shows a typical correction rate characteristic for digital phase lock loops according to the present invention as function of phase error PE exhibited by the output signal. The sloping portion of the correction characteristic 300 has a slope determined by the number of bits in the pulse scaler counter (the up/down counter). The width W corresponds to the maximum jitter amplitude. The portions 302, 304 of the correction characteristic beyond the width W correspond to correction by the phase error counter.

It is to be understood that the present invention is not limited to the above described embodiments, and that various changes and modifications could be effected by one skilled in the art without departing from the spirit or scope of the invention as defined in the appended claims.

What is claimed is:

1. A digital phase lock loop for providing a jitter filtered, periodic output signal based on a periodic input signal which is subject to jitter and frequency offset, the phase lock loop comprising:

a phase detector that receives the input signal and the output signal, detects a phase difference between the input signal and the output signal, outputs at least one first up pulse in a number which is proportional to the phase difference when the input signal leads the output signal, and outputs at least one first down pulse in a number which is proportional to the phase difference when the output signal leads the input signal;

a pulse scaler counter that receives the first up pulse and the first down pulse, increments an up/down counter when the first up pulse is received, decrements the up/down counter when the first down pulse is received, outputs a second up pulse when the up/down counter overflows, and outputs a second down pulse when the up/down counter underflows;

a phase error counter that receives the input signal, the output signal, the first up pulse and the first down pulse, resets an up counter during each period of the input signal and the output signal, increments the up counter when the first up pulse is received, for incrementing the up counter when the first down pulse is received, outputs a third up pulse when the up counter overflows and the input signal leads the output signal, and outputs a third down pulse when the up counter overflows and the output signal leads the input signal; and a first digitally controlled oscillator that produces and outputs the output signal, and that receives the second up pulse, the second down pulse, the third up pulse and the third down pulse, with the first digitally controlled oscillator adjusting a phase of the output signal as follows:

(a) shifting the output signal in a leading direction when the second up pulse is received;

(b) shifting the output signal in a direction opposite the leading direction when the second down pulse is received;

(c) shifting the output signal in the leading direction when the third up pulse is received; and (d) shifting the output signal in the direction opposite the leading direction when the third down pulse is received.

2. A phase lock loop according to claim 1 wherein the phase detector is a digital phase detector.

3. The phase lock loop according to claim 2 wherein the phase detector is a synchronous digital phase detector.

4. A phase lock loop according to claim 3 wherein the up counter of the phase error counter is a digital 3-bit up counter.

5. A phase lock loop according to claim 4 wherein the up/down counter of the pulse scaler counter is a digital 16-bit up/down counter.

6. A phase lock loop according to claim 5 wherein the input signal has a frequency of 8 kilohertz which is subject to periodic jitter having a peak-to-peak amplitude of no more than 1.3 microseconds.

7. The phase lock loop according to claim 6 wherein the synchronous digital phase detector and the digitally controlled oscillator each have a sampling frequency of 12.5 megahertz.

8. A phase lock loop according to claim 3 and further comprising a sampling clock that generates a clock signal and outputs the clock signal to the digital synchronous phase detector, the pulse scaler counter, the phase error counter and the first digitally controlled oscillator, such that digital sampling of the phase lock loop is controlled in synchronization with the sampling clock.

9. A phase lock loop according to claim 1 and further comprising a second digitally controlled oscillator which produces and outputs an output phase-shifted signal which is equal in frequency to the input signal and has a predetermined phase difference with respect to the input signal, and that receives the second up pulse, the second down pulse, the third up pulse and the third down pulse, with the second digitally controlled oscillator adjusting a phase of the output phase-shifted signal as follows:

(a) shifting the output phase-shifted signal in a leading direction when the second up pulse is received;

(b) shifting the output phase-shifted signal in a direction opposite the leading direction when the second down pulse is received;

(c) shifting the output phase-shifted signal in the leading direction when the third up pulse is received; and (d) shifting the output phase-shifted signal in the direction opposite the leading direction when the third down pulse is received.

10. A phase lock loop according to claim 1 and further comprising:

a first 'or' gate that receives the second up pulse and the third up pulse, and outputs the second up pulse and the third up pulse to the first digitally controlled oscillator; and a second 'or' gate that receives the second down pulse and the third down pulse and outputs the second down pulse and the third down pulse to the first digitally controlled oscillator.

11. A phase lock loop according to claim 1 wherein the input signal is subject to periodic jitter having a peak-to-peak amplitude p in nanoseconds and a frequency f in hertz.

12. A phase lock loop according to claim 11 wherein the up/down counter of the pulse scaler counter is a digital counter of n bits with n being equal to:

$$\log_2((p/160+1)/0.001f).$$

13. A phase lock loop according to claim 12 wherein the input signal is subject to periodic jitter of a triangular waveform.

14. A phase lock loop according to claim 1 wherein the up/down counter of the pulse scaler counter rolls to a minimum value at overflow and rolls to a maximum value at underflow.

15. A phase lock loop according to claim 1 wherein the up counter of the phase error counter remains at maximum value at overflow.

16. A digital phase lock loop for providing a jitter filtered, periodic output signal based on a periodic input signal which is subjected to jitter and frequency offset, the phase lock loop comprising:

a digital synchronous phase detector that receives the input signal and the output signal, detects a phase difference between the input signal and the output signal, outputs at least one first up pulse in a number which is proportional to the phase difference when the input signal leads the output signal, and outputs at least one first down pulse in a number which is proportional to the phase difference when the output signal leads the input signal;

a phase error counter that includes:
  an up counter which is incremented when the first up pulse is received, which is incremented when the first down pulse is received, and which outputs an overflow pulse when it overflows;
  a phase start circuit that receives the input signal and the output signal and resets the up counter during each period of the input signal and the output signal;
  a first 'and' gate that receives the first up pulse and the overflow pulse, and outputs a second up pulse when the first up pulse and the overflow pulse are simultaneously received; and
  a second 'and' gate that receives the first down pulse and the overflow pulse, and outputs a second down pulse when the first down pulse and the overflow pulse are simultaneously received;

a pulse scaler counter that receives the first up pulse, the first down pulse and the overflow pulse, the pulse scaler counter including:
  an invertor that receives the overflow pulse, and outputs an inverted overflow pulses only when the overflow pulse is not being received;
  a third 'and' gate that receives the first up pulse and the inverted overflow pulse, and outputs a third up pulse when the first up pulse and the inverted overflow pulse are simultaneously received;
  a fourth 'and' gate that receives the first down pulse and the inverted overflow pulse, and outputs a third down pulse when the first up pulse and the inverted overflow pulse are simultaneously received; and
  an up/down counter that receives the third up pulse and the third down pulse, increments when the third up pulse is received, decrements when the third down pulse is received, outputs a fourth up pulse when the up/down counter overflows, and outputs a fourth down pulse when the up/down counter underflows; and a first digitally controlled oscillator that produces and outputs the output signal, and that receives the second up pulse, the second down pulse, the fourth up pulse and the fourth down pulse, with the first digitally controlled oscillator adjusting a phase of the output signal as follows:
  (a) shifting the output signal in a leading direction when the second up pulse is received;
  (b) shifting the output signal in a direction opposite the leading direction when the second down pulse is received;
  (c) shifting the output signal in the leading direction when the fourth up pulse is received; and
  (d) shifting the output signal in the direction opposite the leading direction when the fourth down pulse is received.

17. A phase lock loop according to claim 16 wherein the up counter of the phase error counter is a digital 3-bit up counter.

18. A phase lock loop according to claim 17 wherein the up/down counter of the pulse scaler counter is a digital 16-bit up/down counter.

19. A phase lock loop according to claim 18 wherein the input signal has a frequency of 8 kilohertz which is subject to periodic jitter having a peak-to-peak amplitude of no more than 1.3 microseconds.

20. A phase lock loop according to claim 19 wherein the synchronous digital phase detector and the first digitally controlled oscillator each have a sampling frequency of 12.5 megahertz.

21. A phase lock loop according to claim 16 and further comprising a sampling clock that generates a clock signal and outputs the clock signal to the digital synchronous phase detector, the pulse scaler counter, the phase error counter and the first digitally controlled oscillator, such that digital sampling of the phase lock loop is controlled in synchronization with the sampling clock.

22. A phase lock loop according to claim 16 and further comprising a second digitally controlled oscillator that produces and outputs an output phase-shifted signal which is equal in frequency to the input signal and has a predetermined phase difference with respect to the input signal, and that receives the second up pulse, the second down pulse, the fourth up pulse and the fourth down pulse, with the second digitally controlled oscillator adjusting a phase of the output phase-shifted signal as follows:
  (a) shifting the output phase-shifted signal in a leading direction when the second up pulse is received;
  (b) shifting the output phase-shifted signal in a direction opposite the leading direction when the second down pulse is received;
  (c) shifting the output phase-shifted signal in the leading direction when the fourth up pulse is received; and
  (d) shifting the output phase-shifted signal in the direction opposite the leading direction when the fourth down pulse is received.

23. A phase lock loop according to claim 16 and further comprising:
  a first 'or' gate that receives the second up pulse and the fourth up pulse, and outputs the second up pulse and the fourth up pulse to the first digitally controlled oscillator; and
  a second 'or' gate that receives the second down pulse and the fourth down pulse and outputting the second down pulse and the fourth down pulse to the first digitally controlled oscillator.

24. A phase lock loop according to claim 16 wherein the input signal is subject to periodic jitter having a peak-to-peak amplitude p in nanoseconds and a frequency f in hertz.

25. A phase lock loop according to claim 16 wherein the up/down counter of the pulse scaler counter is a digital counter of n bits with n being equal to:

$$\log_2((p/160+1)/0.001f).$$

26. A phase lock loop according to claim 25 wherein the input signal is subject to periodic jitter of a triangular waveform.

27. A phase lock loop according to claim 16 wherein:
  the phase error counter further comprises an invertor that receives the overflow pulse, and outputs an inverted overflow pulse to the up counter only when the overflow pulse is not being received; and wherein
  the up counter will function only when the inverted overflow pulse is received from the invertor of the phase error counter.

28. A method for providing a jitter filtered, periodic output signal based on a periodic input signal which is subject to jitter and frequency offset, the method comprising the steps of:
  supplying the periodic input signal and the output signal to a phase detector, with the phase detector detecting a phase difference between the input signal and the output signal, outputting at least one first up pulse in a number which is proportional to the phase difference when the input signal leads the output signal, and outputting at least one first down pulse in a number which is proportional to the phase difference when the output signal leads the input signal;

supplying the first up pulse and the first down pulse to a pulse scaler counter, with the pulse scaler counter incrementing an up/down counter when the first up pulse is received, decrementing the up/down counter when the first down pulse is received, outputting a second up pulse when the up/down counter overflows, and outputting a second down pulse when the up/down counter underflows;

supplying the input signal, the output signal, the first up pulse and the first down pulse to a phase error counter, with the phase error counter resetting an up counter during each period of the input signal and the output signal, incrementing the up counter when the first up pulse is received, incrementing the up counter when the first down pulse is received, outputting a third up pulse when the up counter overflows and the input signal leads the output signal, and outputting a third down pulse when the up counter overflows and the output signal leads the input signal; and supplying the second up pulse, the second down pulse, the third up pulse and the third down pulse to a first digitally controlled oscillator, with the first digitally controlled oscillator producing and outputting the output signal, and with the first digitally controlled oscillator adjusting a phase of the output signal as follows:
  (a) shifting the output signal in a leading direction when the second up pulse is received;
  (b) shifting the output signal in a direction opposite the leading direction when the second down pulse is received;
  (c) shifting the output signal in the leading direction when the third up pulse is received; and
  (d) shifting the output signal in the direction opposite the leading direction when the third down pulse is received.

\* \* \* \* \*